United States Patent
Tsuji et al.

(10) Patent No.: US 8,857,500 B2
(45) Date of Patent: Oct. 14, 2014

(54) HEAT EXCHANGE DEVICE AND HEAT GENERATING ELEMENT CONTAINING DEVICE USING SAME

(75) Inventors: Keisuke Tsuji, Aichi (JP); Mutsuhiko Matsumoto, Aichi (JP); Nobuyuki Yasui, Gifu (JP); Hiroshi Shibata, Aichi (JP); Naoyuki Funada, Aichi (JP); Yuuji Nakano, Aichi (JP); Takahiro Sahashi, Aichi (JP); Keisuke Hagimoto, Aichi (JP); Hirotaka Soga, Aichi (JP); Keisuke Koga, Aichi (JP)

(73) Assignee: Panasonic Corporation, Osaka (JP)

( * ) Notice: Subject to any disclaimer, the term of this patent is extended or adjusted under 35 U.S.C. 154(b) by 845 days.

(21) Appl. No.: 13/123,268

(22) PCT Filed: Oct. 16, 2009

(86) PCT No.: PCT/JP2009/005402
§ 371 (c)(1),
(2), (4) Date: Apr. 8, 2011

(87) PCT Pub. No.: WO2010/047067
PCT Pub. Date: Apr. 29, 2010

(65) Prior Publication Data
US 2011/0192580 A1    Aug. 11, 2011

(30) Foreign Application Priority Data

Oct. 20, 2008   (JP) ................................ 2008-269448
May 22, 2009   (JP) ................................ 2009-123768

(51) Int. Cl.
*H05K 5/00*   (2006.01)
*F24D 5/10*   (2006.01)
(Continued)

(52) U.S. Cl.
CPC .............. *H05K 7/206* (2013.01); *F24F 12/006* (2013.01); *F24F 13/082* (2013.01);
(Continued)

(58) Field of Classification Search
CPC .......... E04G 15/061; H05K 7/20; H05K 5/00; H05K 7/16; H05K 7/20145; H05K 7/202; H05K 7/08; H05K 7/20754; H05K 5/0004; H05K 5/0008; H05K 5/0217; H05K 5/0239; H05K 5/03; F24F 12/006; F24F 13/082
USPC ................ 52/220.8; 361/695, 696, 724–726; 454/184; 312/236, 242; 165/166, 165/53–55; 277/312, 314, 323
See application file for complete search history.

(56) References Cited

U.S. PATENT DOCUMENTS 2,164,589 A * 7/1939 Money ............................ 62/454
3,123,987 A * 3/1964 Moore ............................ 62/263
(Continued)

FOREIGN PATENT DOCUMENTS

DE   196 41 553    4/1998
DE   19641553     4/1998
(Continued)

OTHER PUBLICATIONS

The Extended European Search Report of EP Application No. 09821767.2, dated Jun. 4, 2012.
(Continued)

*Primary Examiner* — Allen Flanigan
*Assistant Examiner* — Jason Thompson
(74) *Attorney, Agent, or Firm* — Panasonic Patent Center

(57) ABSTRACT

A main body case containing therein an air blower for circulating ambient air and a heat exchanger for exchanging heat between the ambient air circulated by the air blower and inside air, flange provided in main body case and having wall surface joining surface joined to wall surface where main body case is arranged, and cover attached to flange, having a louver in a side of the inside air, and a plurality of opening holes in a side of the ambient air and covering the ambient air side of main body case, thereby making an attachment and a detachment of cover easy, and achieving a reduction of a maintenance work.

16 Claims, 17 Drawing Sheets

(51) Int. Cl.
*F24H 3/02* (2006.01)
*F24D 19/02* (2006.01)
*H05K 7/20* (2006.01)
*F24F 12/00* (2006.01)
*F24F 13/08* (2006.01)
*F24F 13/20* (2006.01)

(52) U.S. Cl.
CPC .............. *F24F 13/20* (2013.01); *F24F 2221/52* (2013.01); *Y02B 30/16* (2013.01); *Y02B 30/563* (2013.01)
USPC .................. 165/54; 165/53; 165/55; 361/724

(56) References Cited

U.S. PATENT DOCUMENTS

| | | | | |
|---|---|---|---|---|
| 3,504,617 | A | * | 4/1970 | Merklin et al. ............... 454/236 |
| 4,949,867 | A | * | 8/1990 | Immel ...................... 220/592.11 |
| 5,032,954 | A | * | 7/1991 | Juza ............................... 361/802 |
| 5,035,281 | A | * | 7/1991 | Neuenfeldt et al. ............ 165/76 |
| 5,372,189 | A | * | 12/1994 | Tsunekawa et al. ............ 62/262 |
| 5,738,166 | A | * | 4/1998 | Chou ....................... 165/104.21 |
| 6,386,845 | B1 | * | 5/2002 | Bedard .................... 417/423.15 |
| 6,480,243 | B2 | * | 11/2002 | Yamamoto .................... 348/836 |
| 6,817,940 | B2 | * | 11/2004 | Pfannenberg ................. 454/184 |
| 8,251,136 | B2 | | 8/2012 | Shibata et al. |
| 2004/0080912 | A1 | * | 4/2004 | Goth et al. ..................... 361/699 |
| 2006/0172685 | A1 | * | 8/2006 | O'Brien ........................ 454/184 |
| 2010/0015904 | A1 | * | 1/2010 | Yeh et al. ...................... 454/184 |

FOREIGN PATENT DOCUMENTS

| | | |
|---|---|---|
| JP | 9-152284 | 6/1997 |
| JP | 2000-161875 | 6/2000 |
| JP | 2005-98572 | 4/2005 |
| JP | 2005-098572 | 4/2005 |
| JP | 2005-310924 | 11/2005 |
| JP | 2008-091606 | 4/2008 |
| JP | 2008-91606 | 4/2008 |
| JP | 2008-227136 | 9/2008 |
| WO | WO 2008111310 A1 * | 9/2008 |

OTHER PUBLICATIONS

International Search Report of PCT Application No. PCT/JP2009/005402, dated Nov. 17, 2009.

* cited by examiner

HEAT EXCHANGE DEVICE AND HEAT GENERATING ELEMENT CONTAINING DEVICE USING SAME

TECHNICAL FIELD

The present invention relates to a heat exchange device and a heat generating element containing device using the same.

BACKGROUND ART

For example, since a current of several tens amperes or more flows in a base station of a cellular phone, the base station is sometimes expressed as a heat generating element. In other words, it is extremely important for stabilizing the performance thereof to cool. The base station of the cellular phone as mentioned above is provided, for example, with a heat exchange device having a configuration shown in Patent Document 1, for carrying out its cooling.

The base station of the cellular phone includes a cabinet which contains a transmitter receiver serving as the heat generating element, and a heat exchange device which is installed to an opening portion of the cabinet. FIG. 18 is a configuration view of the heat exchange device disclosed in Patent Document 1. In FIG. 18, heat exchange device 201 is provided with main body case 211 which has first suction port 207 and first discharge port 208 for ambient air, and second suction port 209 and second discharge port 210 for air in a cabinet. Further, heat exchange device 201 is provided with first air blower 212 for ambient air and second air blower 213 for air in the cabinet, in main body case 211. Further, heat exchange device 201 is provided with heat exchanger 214 exchanging heat between outdoor air and air in the cabinet in main body case 211.

Further, although not shown, heat exchange device 201 is provided with a louver for preventing rainwater and the like from making an intrusion, in a front surface side in which first suction port 207 of main body case 211 is arranged. Main body case 211 is attached to a door of a cabinet so as to be openable and closable. A cover having a punching hole is attached to the door from an outer side in such a manner as to cover a front surface (a surface provided with first suction port 207) of heat exchange device 201.

In the conventional heat exchange device mentioned above, since main body case 211 is attached to the door of the cabinet, it is possible to carry out an attachment of main body case 211 in a state where the door is open. Further, an attachment place of main body case 211 is not limited to the door, but it may be attached to a wall surface or the like of the cabinet. In that case, an opening portion may be provided in the wall surface of the cabinet, and the main body case may be attached in such a manner as to protrude out of the wall surface. However, in recent years, various attachment places have been demanded in the heat exchange device mentioned above. In other words, it is demanded to provide an opening portion on a wall surface of an existing structure and install by embedding in the opening portion. In the case mentioned above, there become issues that an installation operation should be carried out from an outer side of the wall surface, and maintenance can be easily executed from the outer side of the wall surface.

PRIOR ART DOCUMENT

Patent Document

Patent Document 1: Unexamined Japanese Patent Publication No. 2000-161875

DISCLOSURE OF THE INVENTION

The present invention provides a heat exchange device which can be easily maintained from an outer side of a heat exchange device, and a heat generating element containing device using the same.

A heat exchange device of the present invention has a main body case which includes therein an air blower for circulating ambient air and a heat exchanger for exchanging heat between the ambient air circulated by the air blower and inside air, a flange which is provided in the main body case and has a wall surface joining surface joined to a wall surface where the main body case is disposed, and a cover which is attached to the flange, has a louver in a side of the inside air, has a plurality of opening holes in a side of the ambient air and covers the ambient air side of the main body case.

With this configuration, it becomes easy to attach and detach the cover, and it is possible to achieve a reduction of a maintenance work from the outer side of the device.

PREFERRED EMBODIMENTS FOR CARRYING OUT OF THE INVENTION

A description will be given below of embodiments according to the present invention with reference to the accompanying drawings. However, the present invention is not limited to these embodiments.

(Embodiment 1)

Figure 1:
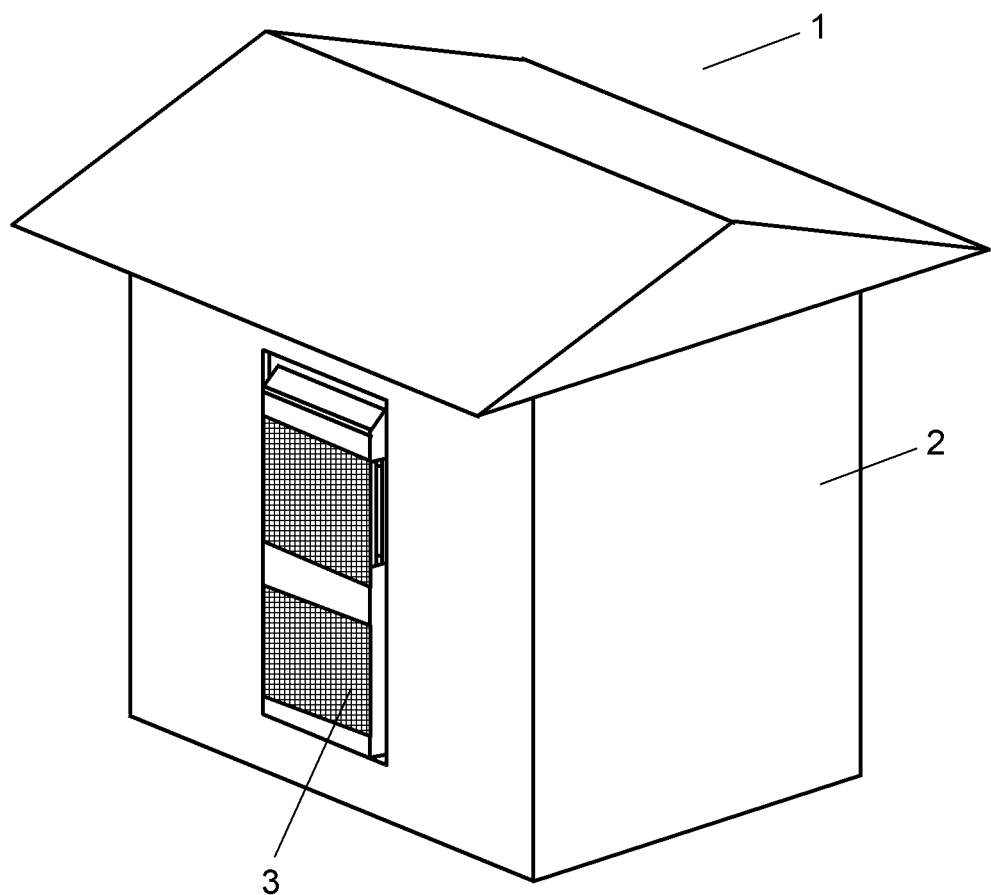
FIG. 1 is a perspective view showing a heat generating element containing device provided with a heat exchange device in Embodiment 1 of the present invention.

FIG. 1 is a perspective view showing an embodiment of a heat generating element containing device according to the present invention. Further, FIG. 1 is a perspective view showing a base station provided with a heat exchange device in Embodiment 1 of the present invention. In FIG. 1, base station 1 of a cellular phone is installed in various places. Base station 1 includes box-shaped cabinet 2, and a transmitter receiver which is contained in cabinet 2. One side surface of cabinet 2 is provided with heat exchange device 3 according to the present embodiment in such a manner as to be embedded in a wall surface forming a side surface from an outer side (an ambient air side).

Figure 2:
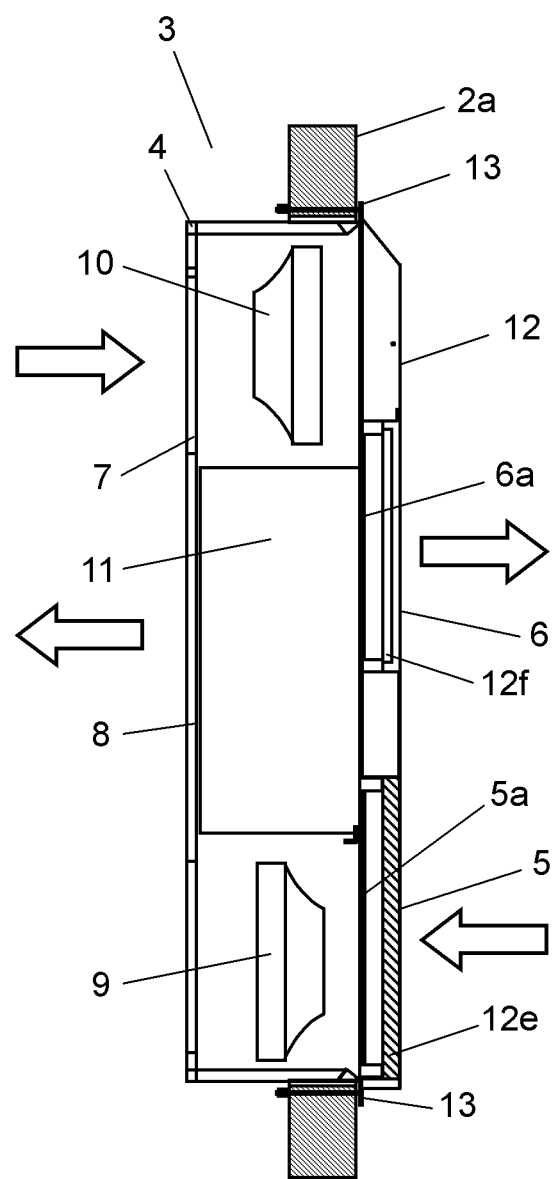
FIG. 2 is a side cross sectional view of the heat exchange device in Embodiment 1.

FIG. 2 is a cross sectional view of a heat exchange device in an embodiment of the present invention. In FIG. 2, heat exchange device 3 is provided with main body case 4 and cover 12 for covering a front surface of main body case 4. Main body case 4 is therein provided with ambient air blower 9 for circulating ambient air (outside air) in its lower portion, and inside air blower 10 for circulating inside air (air in cabinet 2) in its upper portion, respectively. In FIG. 2, a right side is an ambient air side, and is a front surface of heat exchange device 3. In FIG. 2, a left side is an inside air side, and is a rear surface of heat exchange device 3. Further, main body case 4 is therein provided with heat exchanger 11 for exchanging heat between ambient air circulated by ambient air blower 9 and inside air circulated by inside air blower 10. Main body case 4 has inside air suction port 7 sucking the inside air and inside air discharge port 8 discharging the inside air. An outer periphery of main body case 4 is provided with flange 13 having a wall surface joining surface joined to wall surface 2a in which main body case 4 is arranged. The ambient air side (the front surface) of main body case 4 is covered by cover 12 which is joined to flange 13. Cover 12 has ambient air suction port 5 sucking the ambient air and ambient air discharge port 6 discharging the ambient air. Ambient air sucking louver 12e is provided in an ambient air side of ambient air suction port 5, and ambient air discharging louver 12f is provided in an ambient air side of ambient air discharge port 6. Further, main body case 4 has main body case ambient air suction port 5a and main body case ambient air discharge port 6a at positions which are opposed to ambient air suction port 5 and ambient air discharge port 6. Main body case ambient air discharge port 6a corresponds to a discharge port of heat exchanger 11.

With this configuration, in the heat exchange device 3 the heat exchanger 11 performs cooling of the transmitter receiver. Specifically, because the transmitter receiver flows a current of several tens amperes or more, the temperature becomes higher. If the high temperature of the transmitter receiver is not dealt with, characteristics thereof become unstable. When an operation of heat exchange device 3 is carried out, a high-temperature inside air in cabinet 2 is again supplied into cabinet 2 through heat exchanger 11 by inside air blower 10. On the other hand, the ambient air having a lower temperature than the inside air is discharged to the ambient air side through heat exchanger 11 by ambient air blower 9. In heat exchanger 11, heat exchange is carried out between the inside air having the higher temperature and the ambient air having the lower temperature. Accordingly, the inside air is cooled so as to be supplied to cabinet 2, and an inner side of cabinet 2 is cooled. As mentioned above, a cooling in cabinet 2 is carried out by the heat exchange with the ambient air by heat exchanger 11. Therefore, a destabilization of the transmitter receiver is prevented.

Figure 6:
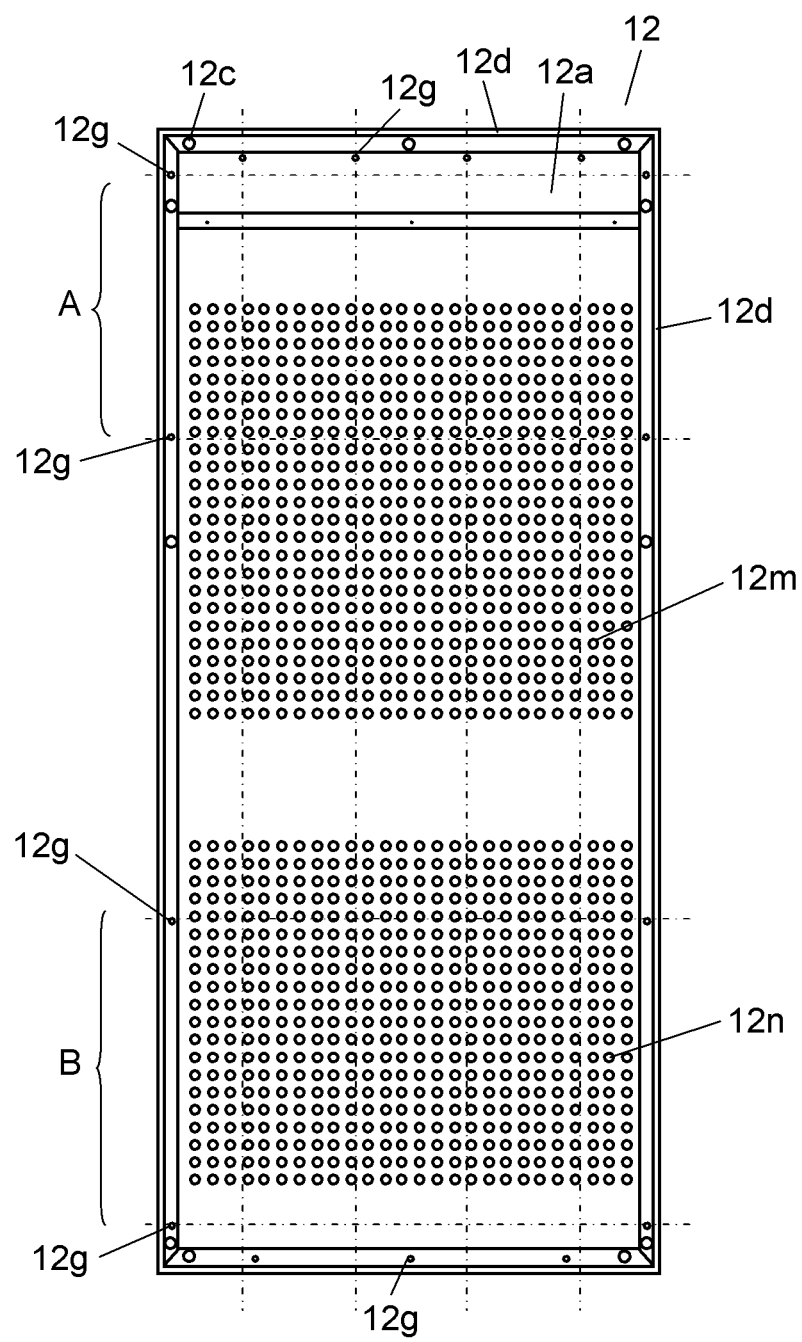
FIG. 6 is a detail view of the cover of the heat exchange device in Embodiment 1 as seen from an ambient air side.

Heat exchange device 3 according to the present embodiment is attached so as to be embedded into wall surface 2a of cabinet 2 (FIG. 1), as shown in FIG. 2. A front surface (a right side of the drawing) corresponding to the ambient air side of heat exchange device 3 is provided with cover 12 for improving a beauty of an outer appearance and protecting ambient air suction port 5. A plurality of vent holes (punching holes mentioned below) are provided in the ambient air side of cover 12, for passing the air through (FIG. 6). Main body case 4 of heat exchange device 3 is provided with flange 13 protruding to a peripheral edge corresponding to an outer periphery of main body case 4 approximately on the same surface as the front surface of heat exchange device 3.

Figure 3:
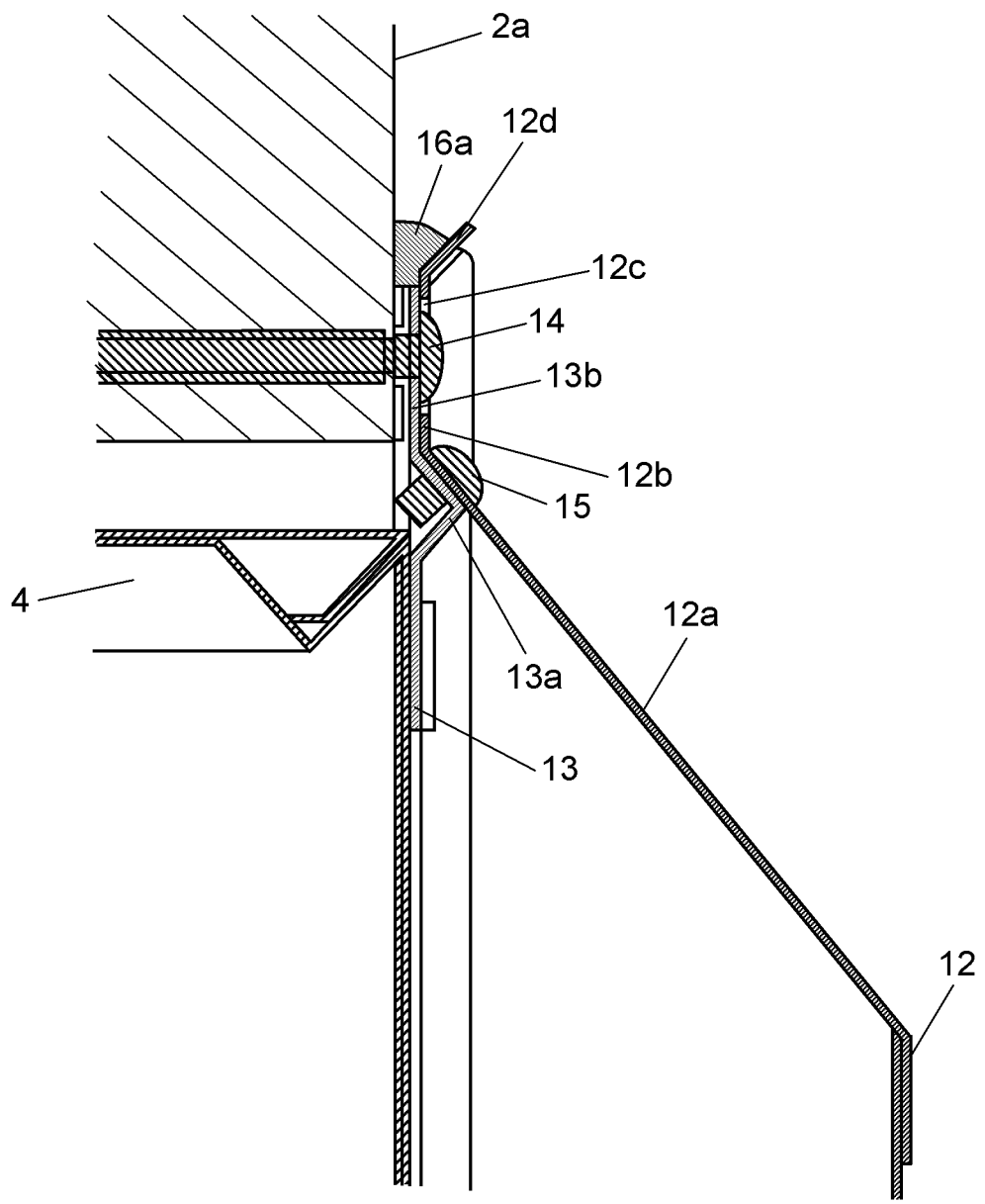
FIG. 3 is a detail view of a main part of the heat exchange device in Embodiment 1.

FIG. 3 is a detail view of a main part of the heat exchange device in the present embodiment, and shows details of an attaching portion of cover 12. Flange 13 has bent portion 13a formed into an L-shaped cross section in a manner to extend to the ambient air side, in a joining portion (a root portion) with main body case 4, as shown in FIG. 3. Further, flange 13 has wall surface joining surface 13b corresponding to a portion which is joined to wall surface 2a where main body case 4 is arranged. Heat exchange device 3 is fitted in such a manner as to be embedded from an outer side of a front surface side (a right side of the drawing) corresponding to the ambient air side of wall surface 2a, and is fixed by screwing wall surface joining surface 13b of flange 13 and wall surface 2a with main body fixing screw 14 serving as a main body fixing member.

On the other hand, cover 12 is provided with flange joining inclined surface 12a which comes into contact with an outer peripheral side of bent portion 13a provided in flange 13, in its outer periphery. An inclined surface around the peripheral side of bent portion 13a is provided with a thread hole (thread hole 12g shown in FIG. 6) serving as cover fixing holes for attaching cover 12. An outer peripheral side of bent portion 13a and flange joining inclined surface 12a are connected by cover fixing screw 15 (a screwing member) serving as a cover fixing member via the thread hole. Further, cover 12 is provided with edge portion 12b in a further outer peripheral side of flange joining inclined surface 12a, in such a manner as to come into contact with wall surface joining surface 13b of flange 13. Edge portion 12b is provided with hole 12c in such a manner as to stay away from main body fixing screw 14 for carrying out a screw fixing between wall surface joining surface 13b of flange 13 and wall surface 2a. Accordingly, cover 12 is connected only by bent portion 13a of flange 13.

With this configuration, in the case that heat exchange device 3 is installed in wall surface 2a of cabinet 2, first of all, cover 12 is attached to flange 13. Next, since hole 12c is provided in edge portion 12b of cover 12 in such a manner as to stay away from main body fixing screw 14 for joining flange 13 and wall surface 2a, a screw fixing work between flange 13 and wall surface 2a can be carried out while keeping cover 12 being attached.

Further, fold-back portion 12d bent toward the ambient air side of heat exchange device 3 is formed in a further outer peripheral side of edge portion 12b of cover 12. A space formed between fold-back portion 12d and wall surface 2a comes to a space for applying caulking agent 16a in such a manner as to prevent the water from making an intrusion into an inner portion. A caulking work can be easily carried out by this space. Accordingly, a caulking work can be securely carried out.

Figure 4:
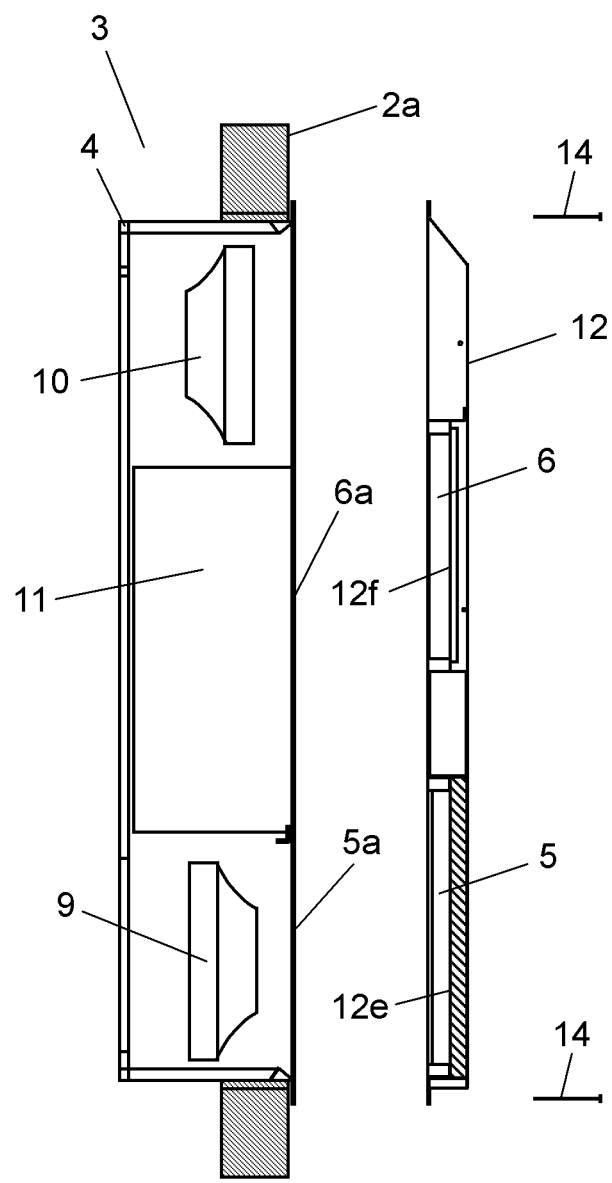
FIG. 4 is a cross sectional view of the heat exchange device in Embodiment 1 in a state where a cover is detached.
Figure 5:
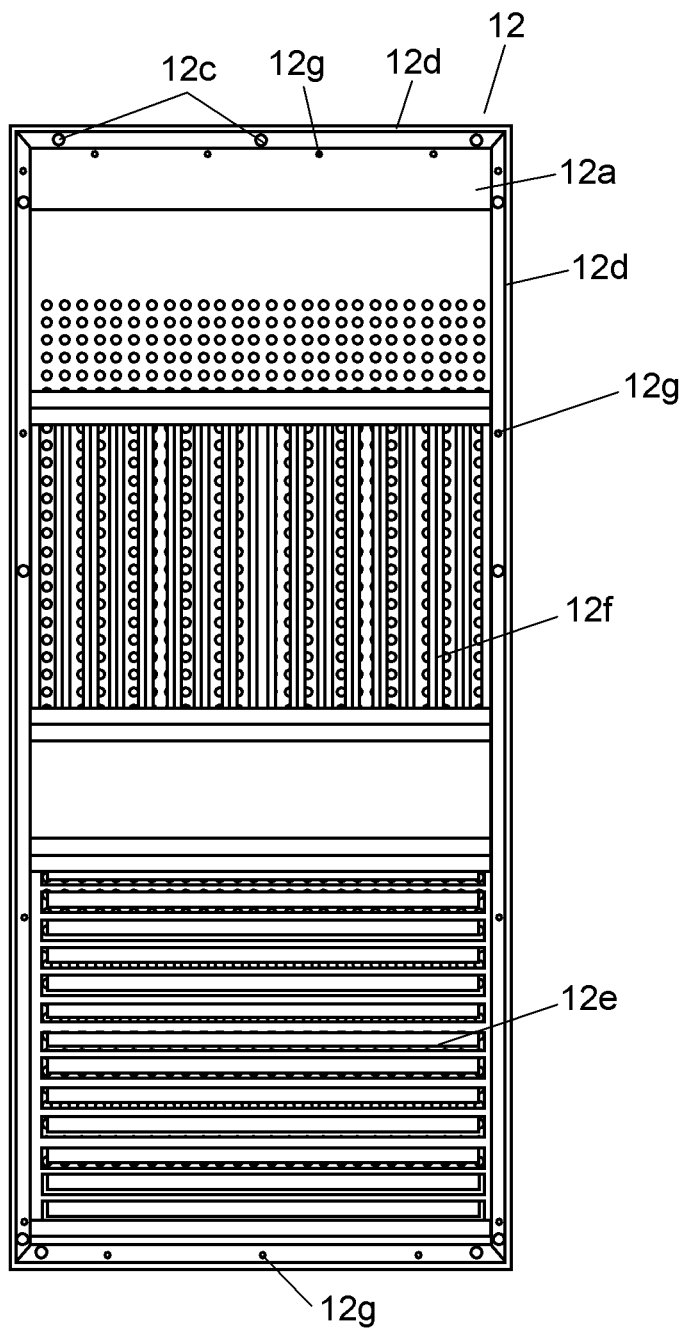
FIG. 5 is a detail view of the cover of the heat exchange device in Embodiment 1 as seen from an inside air side.

FIG. 4 is a cross sectional view of heat exchange device 3 in the present embodiment in a state where cover 12 is detached. FIG. 5 is a detail view of cover 12 of heat exchange device 3 in the present embodiment as seen from an inside air side (a back side). As shown in FIGS. 4 and 5, ambient air sucking louver 12e and ambient air discharging louver 12f are provided integrally with cover 12 in an inner side of cover 12 in such a manner as to form an air flow. Ambient air sucking louver 12e provided in ambient air suction port 5 side is provided with its louver boards in a horizontal direction (a lateral direction), and each of the louver boards has such an incline as to descend to an ambient air side (a right side in FIG. 4). Ambient air sucking louver 12e prevents a water content caused by a rain and the like from outward from making an intrusion. Ambient air discharging louver 12f close to one ambient air discharge port 6 is provided with the louver board in a vertical direction (a longitudinal direction), and is structured such that the air easily flows.

Further, FIG. 6 is a detail view of cover 12 of heat exchange device 3 in the present embodiment as seen from an ambient air side (a front side), and shows details of a position of cover fixing holes. As shown in FIG. 6, a screw pitch of thread hole 12g corresponding to the cover fixing holes mentioned above and provided in cover 12 is differentiated between screw pitch A in an upper side (an ambient air discharge side) and screw pitch B in a lower side (an ambient air suction port side). In the present embodiment, screw pitch A is made smaller than screw pitch B. Cover 12 cannot serve a function by ambient air sucking louver 12e and ambient air discharging louver 12f, if it gets up and down wrong. Therefore, with this configuration, an attaching error of cover 12 runs short, and an original function can be achieved.

In this case, in the present embodiment, main body fixing screw 14 is fixed by screw fixing to wall surface 2a, at the time of fixing heat exchange device 3 to wall surface 2a. However, the same operation and effect can be obtained even by putting a screw or a bolt through wall surface 2a and fixing while using a nut.

Further, in the present embodiment, a screw head of main body fixing screw 14 is faced to an outdoor. Accordingly, it is desirable to use a special screw which cannot be easily detached, for example, such a screw as a carriage screw or a one-way screw (which can be fastened by a normal screw driver or the like, however, requires a special purpose tool for detaching).

A plurality of ambient air discharging vent holes 12m are formed by a punching hole at positions corresponding to ambient air discharge ports 6 of cover 12, that is, positions corresponding to ambient air discharging louvers 12f. Further, a plurality of ambient air sucking vent holes 12n are formed by a punching hole at positions corresponding to ambient air suction ports 5 of cover 12, that is, ambient air sucking louvers 12e.

(Embodiment 2)

Figure 7:
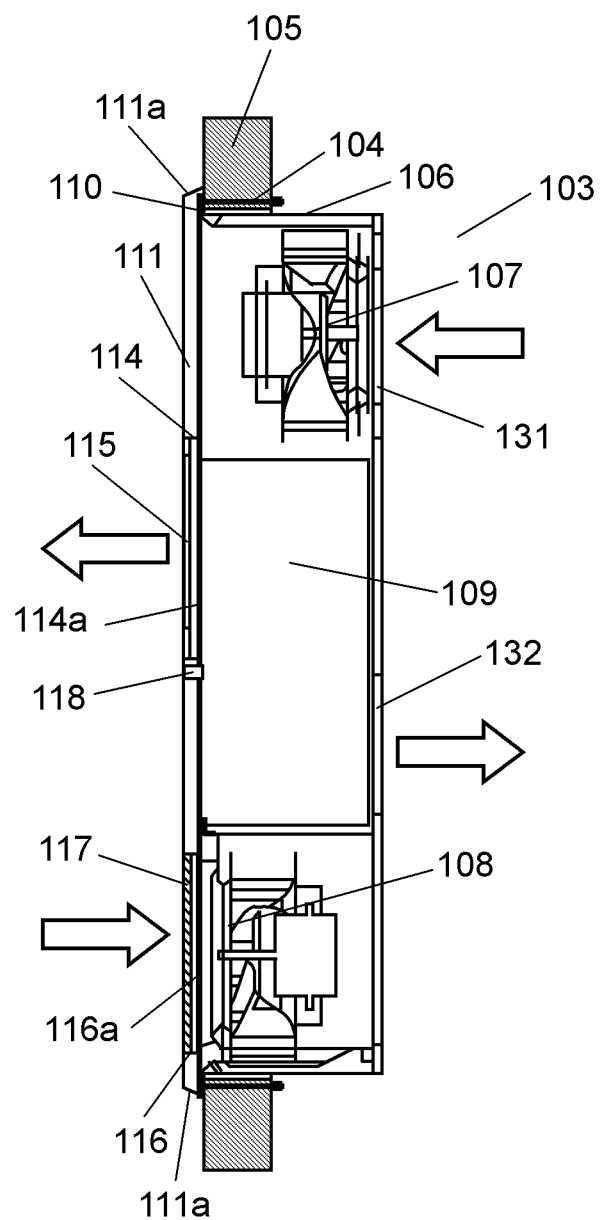
FIG. 7 is a side cross sectional view of a heat exchange device in Embodiment 2 of the present invention.
Figure 8:
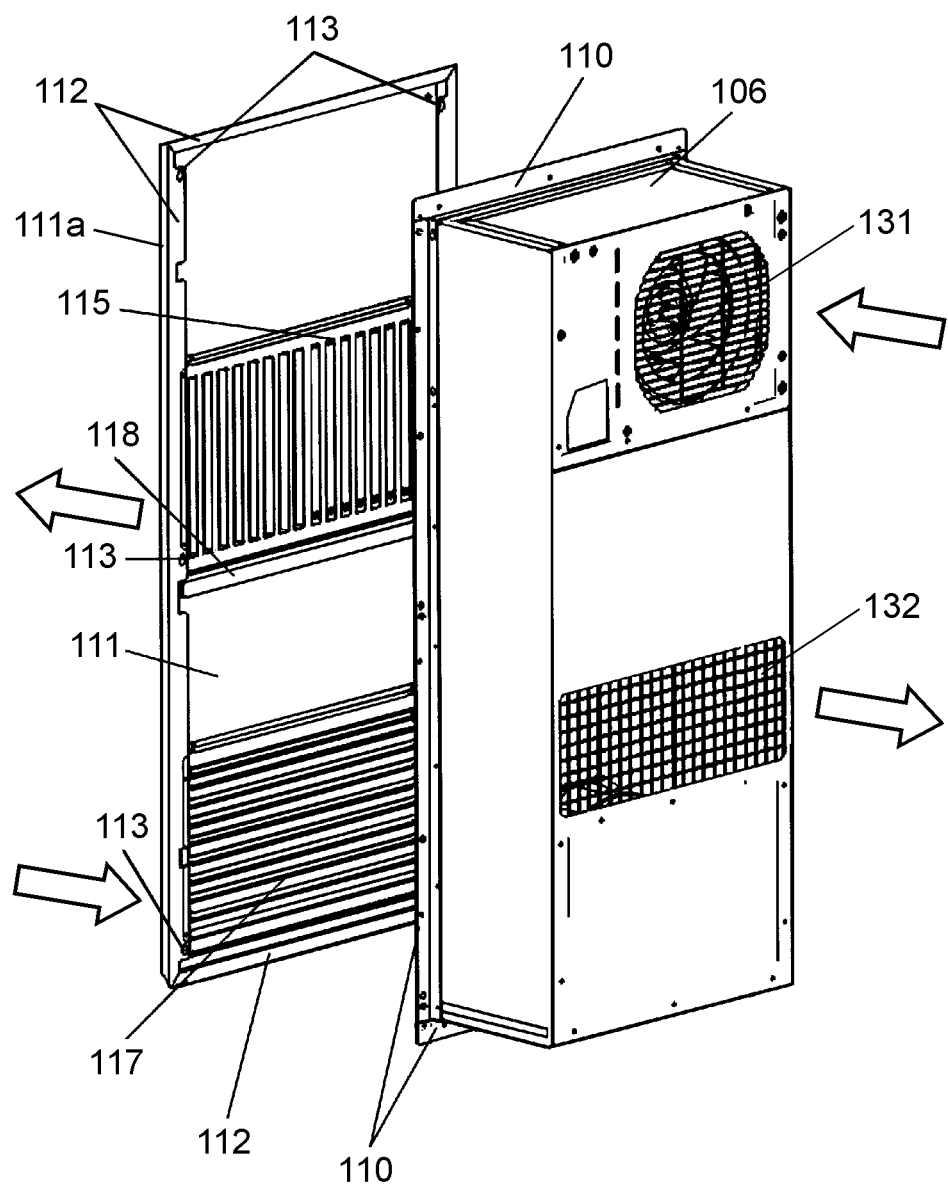
FIG. 8 is a perspective view of the heat exchange device in Embodiment 2 in a state where a cover is detached, as seen from an inside air side.

FIG. 7 is a side cross sectional view of a heat exchange device in Embodiment 2 of the present invention. FIG. 8 is a perspective view of the heat exchange device in the present embodiment in a state where a cover is detached, as seen from an inside air side. Heat exchange device 103 in the present embodiment is fixed to wall surface 105 by main body fixing screw 104 serving as a main body fixing member in such a manner as to be embedded into an opening portion provided in wall surface 105 of cabinet 2 (see FIG. 1). In FIG. 7, a right side is the inside air side, and a left side is an ambient air side.

Heat exchange device 103 is provided with inside air blower 107 for circulating the inside air to an upper portion in an inner portion of box-shaped main body case 106, and ambient air blower 108 for circulating the ambient air to a lower portion. Further, heat exchange device 103 is provided with heat exchanger 109 for exchanging heat between the inside air circulated by inside air blower 107 and the ambient air circulated by ambient air blower 108, in its center portion. Inside air suction port 131 is formed at a position which is opposed to inside air blower 107 in the inside air side of main body case 106. Further, inside air discharge port 132 is formed at a position which is opposed to heat exchanger 109 in the inside air side of main body case 106.

Further, flange 110 having an L-shaped cross sectional shape is provided around the periphery of main body case 106 of heat exchange device 103. One surface of the L-shaped form of flange 110 is fixed to main body case 106, and main body case 106 is fixed to wall surface 105 by main body fixing screw 104 via wall surface joining surface corresponding to the other surface. Accordingly, heat exchange device 103 is fixed to wall surface 105.

Cover 111 is fixed to flange 110 in such a manner as to cover the ambient air surface, in the ambient air side of main body case 106. In an upper surface, a bottom surface and a side surface of cover 111, there is formed inclined surface 111a which becomes narrower from an inside air side (a side of wall surface 105) toward an ambient air side (an outdoor side). In other words, upper surface of cover 111 has inclined surface 111a which comes down from the inside air side to the ambient air side, and the bottom surface has inclined surface 111a which comes up from the inside air side to the ambient air side. Further, a right surface as seen from the ambient air side has inclined surface 111a which is directed to a left side from a right side, and a left surface as seen from the ambient air side has inclined surface 111a which is directed from a left side to a right side. An outer periphery of cover 111 has fixing surface 112 which is bent to an inner portion of cover 111 as shown in FIG. 8. Cover fixing hole 113 is provided in fixing surface 112.

In an inner portion of cover 111, ambient air discharge port 114 is provided in correspondence to main body case ambient air discharge port 114a of main body case 106, and ambient air discharging louver 115 is provided in an ambient air side of ambient air discharge port 114. Ambient air suction port 116 is provided in correspondence to main body case ambient air suction port 116a of main body case 106, and ambient air sucking louver 117 is provided in an ambient air side of ambient air suction port 116. Ambient air discharging louver 115 and ambient air sucking louver 117 are provided integrally in cover 111. Further, packing 118 is provided as a partition member for preventing a short circuit that the ambient air discharged from ambient air discharge port 114 is directly sucked into ambient air suction port 116, between ambient air discharge port 114 and ambient air suction port 116.

Figure 9:
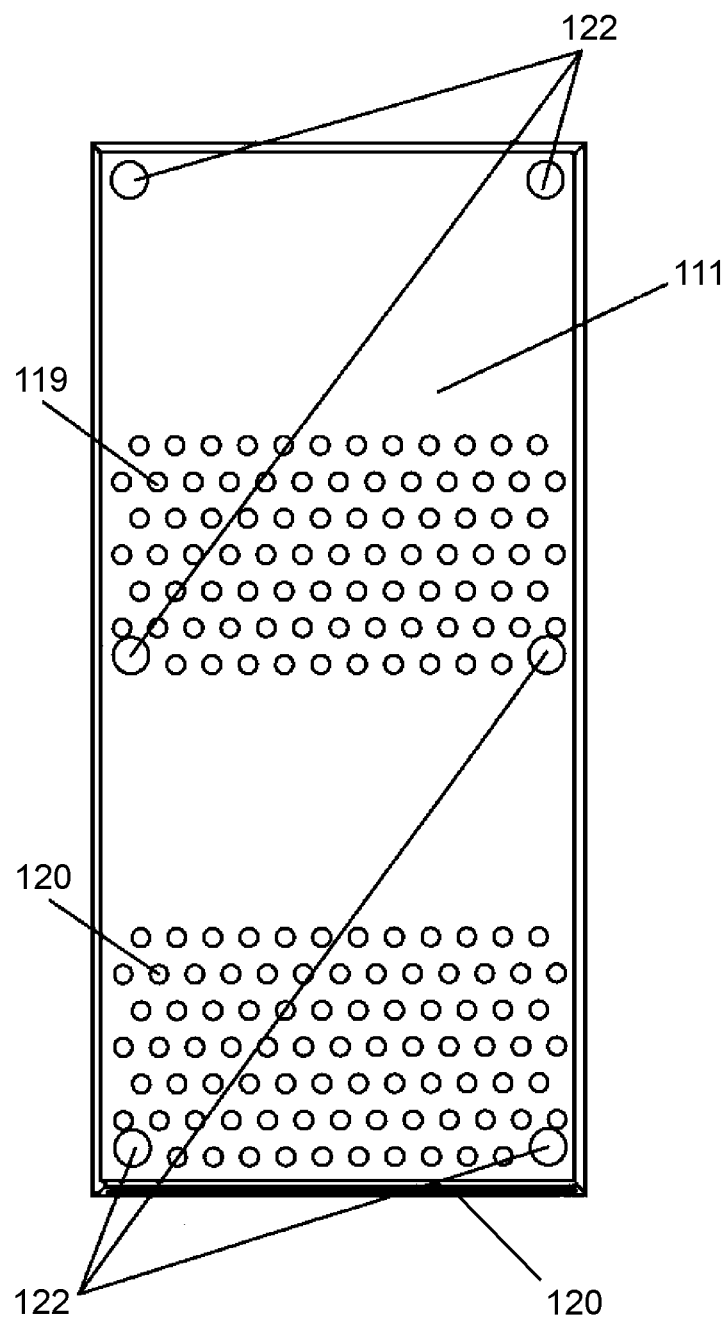
FIG. 9 is a front view of the cover of the heat exchange device in Embodiment 2 as seen from an ambient air side.

FIG. 9 is a front view of the cover of the heat exchange device in the present embodiment as seen from the ambient air side. As shown in FIG. 9, cover 111 is provided with a plurality of ambient air discharging vent holes 119 formed by small holes at the position opposed to ambient air discharge port 114. Further, cover 111 is provided with a plurality of ambient air sucking vent holes 120 formed by small holes at the position opposed to ambient air suction port 116 and in a bottom surface of cover 111.

Figure 10:
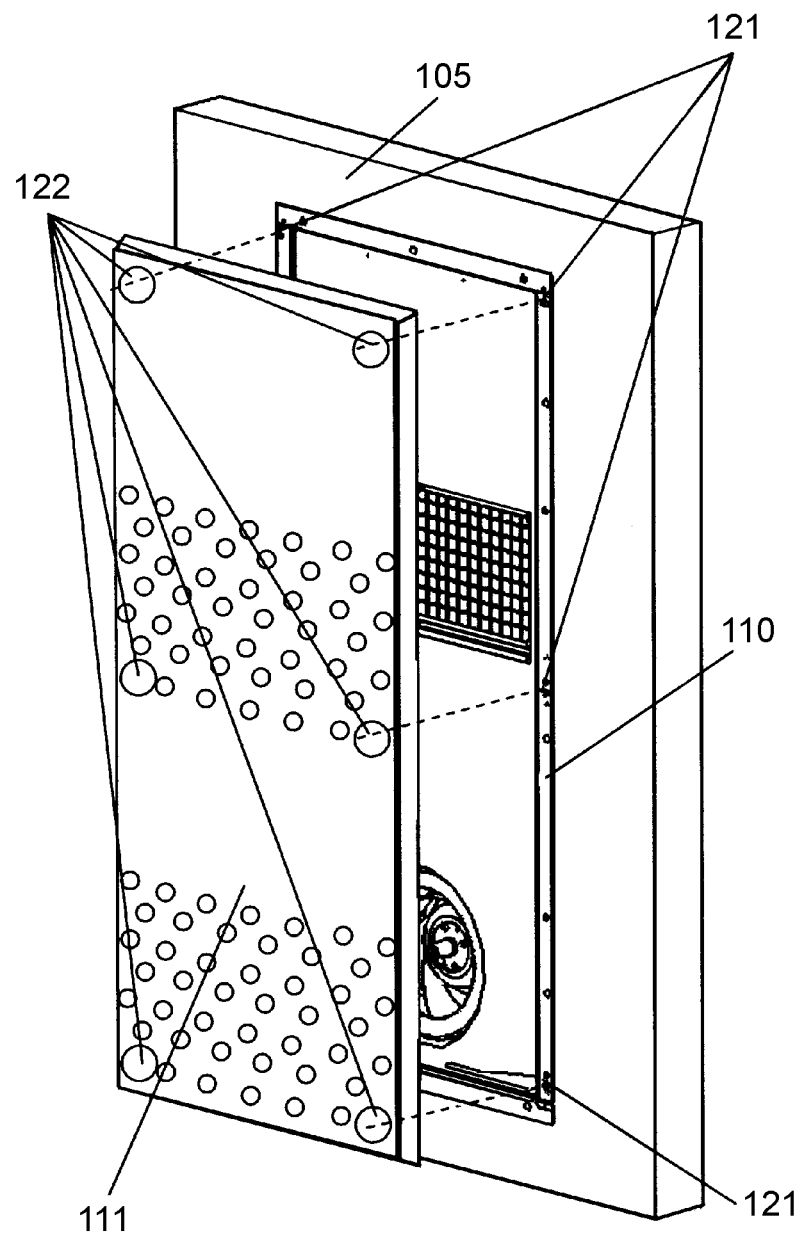
FIG. 10 is a perspective view of the heat exchange device in Embodiment 2 in a state where the cover is detached as seen from the ambient air side.
Figure 11:
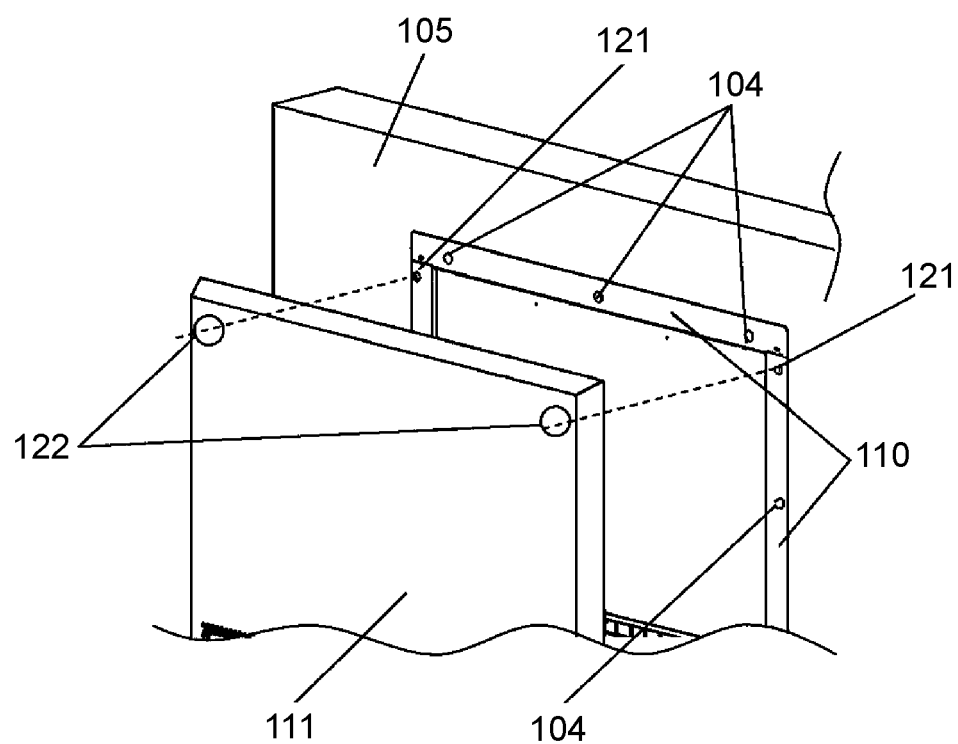
FIG. 11 is a perspective view of an upper portion of the heat exchange device in Embodiment 2 in the state where the cover is detached.

FIGS. 10 and 11 are a perspective view and an upper portion perspective view of the heat exchange device in the present embodiment installed in wall surface 105 in a state where the cover is detached, as seen from an ambient air side. As shown in FIGS. 10 and 11, cover 111 is fixed to flange 110 by cover fixing screw 121 corresponding to a cover fixing member via cover fixing hole 113 of fixing surface 112 shown in FIG. 8. Further, cover attaching and detaching hole 122 is provided at a position which is opposed to cover fixing screw 121, in an ambient air side (a front surface) of cover 111.

Figure 12:
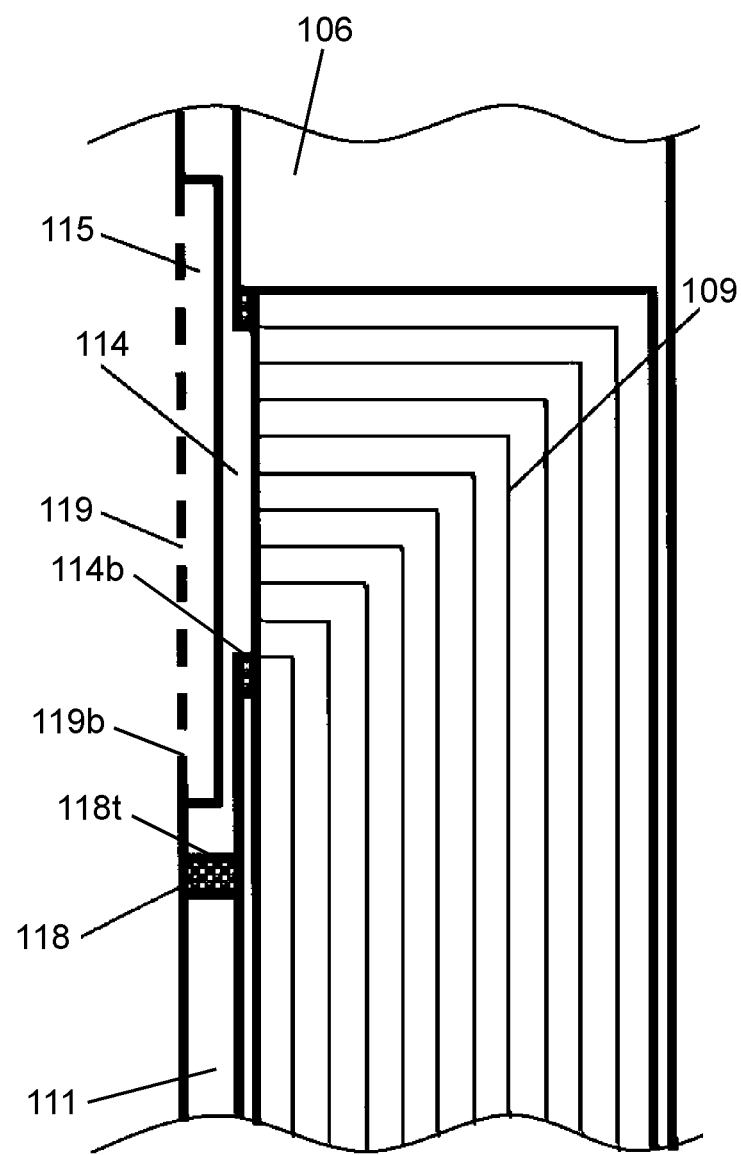
FIG. 12 is a side cross sectional view of the heat exchange device in Embodiment 2 in the vicinity of an ambient air discharge port.

FIG. 12 is a side cross sectional view of an inner portion of the cover of the heat exchange device in the present embodiment in the vicinity of an ambient air discharge port. As shown in FIG. 12, in a positional relationship in a vertical direction of ambient air discharge port 114, packing 118 and ambient air discharging vent hole 119, lower end 119b of ambient air discharging vent hole 119 is lower than lower end 114b of ambient air discharge port 114. Further, upper end 118t of packing 118 is lower than lower end 119b of ambient air discharging vent hole 119. In other words, the lower end of ambient air discharge port 114, lower end 119b of ambient air discharging vent hole 119, and upper end 118t of packing 118 are arranged in this order from the above. Further, lower end 119b of ambient air discharging vent hole 119 is positioned between ambient air discharge port 114 and ambient air suction port 116.

Figure 13:
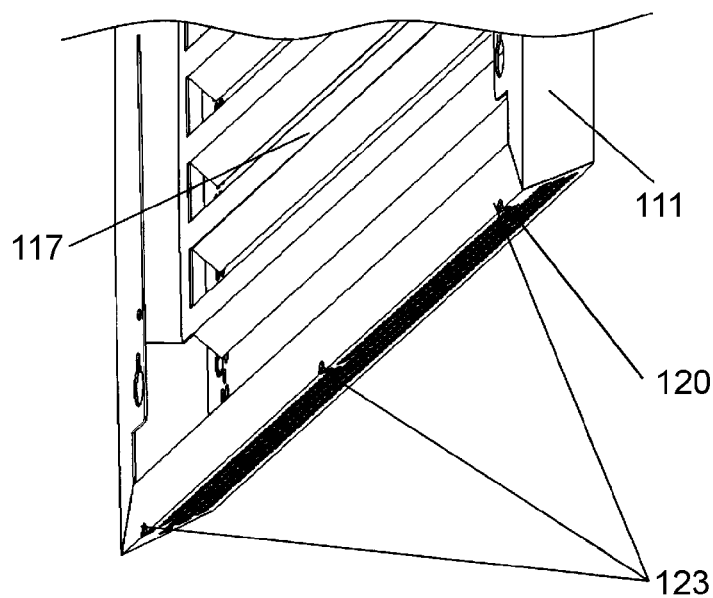
FIG. 13 is a perspective view showing a lower portion of the cover of the heat exchange device in Embodiment 2.

FIG. 13 is a perspective view of a lower portion of the cover of the heat exchange device in the present embodiment as seen from the inside air side. As shown in FIG. 13, draining small holes 123 are provided at three positions in a lowest portion of the bottom surface of cover 111.

Figure 14:
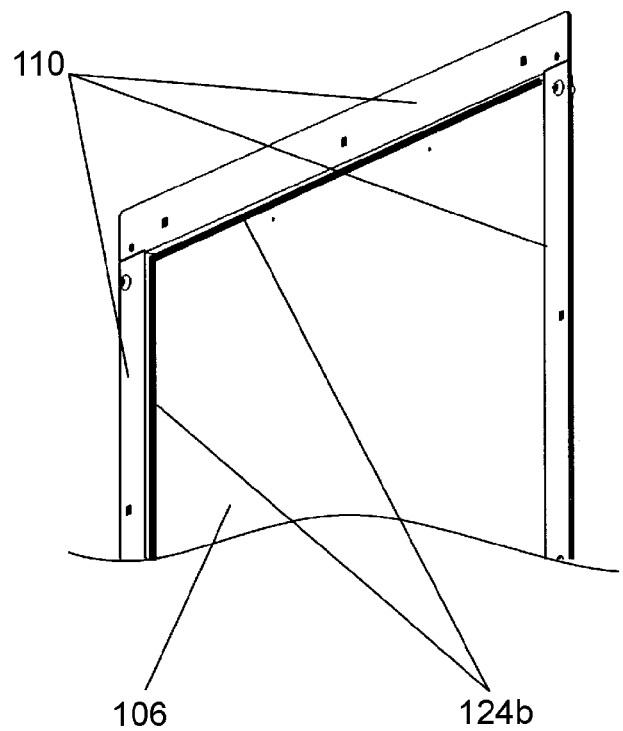
FIG. 14 is a perspective view of a main body case in a state where the cover of the heat exchange device in Embodiment 2 is detached, as seen from the ambient air side.
Figure 15:
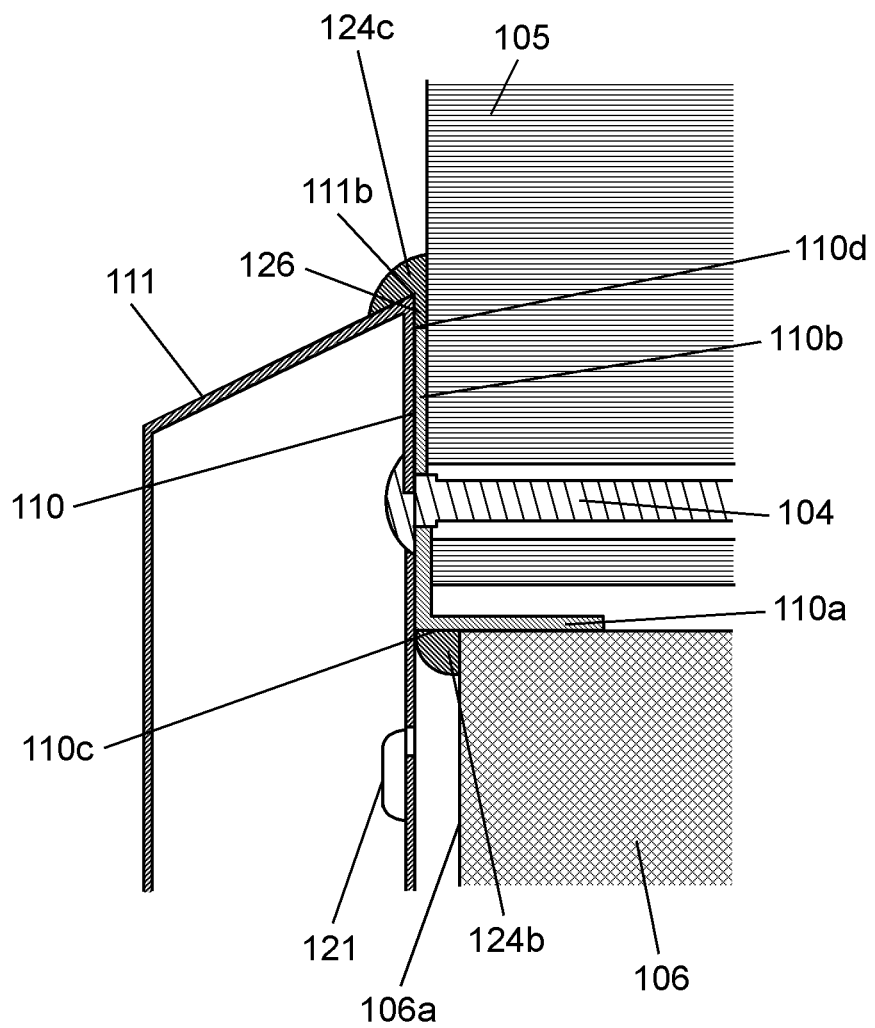
FIG. 15 is a detail view of a main part of the heat exchange device in Embodiment 2.

FIG. 14 is a perspective view of the flange and the main body case in a state where the cover of the heat exchange device in the present embodiment is detached, as seen from the ambient air side. FIG. 15 is a detail view of a main part of the heat exchange device in the present embodiment, and a side cross sectional view of the upper portion. As shown in FIGS. 14 and 15, other surface 110b of surface 110a fixed to main body case 106 of flange 110, that is, surface 110b to which cover 111 is fixed, is protruded to the ambient air side (the side of cover 111) with respect to surface 106a in a front surface side close to the ambient air of main body case 106 so as to form protruding portion 110c. Caulking agent 124b is applied to a corner portion all around an entire periphery of flange 110, which is formed by main body case 106 and protruding portion 110c of flange 110.

Further, as shown in FIG. 15, end portion 110d of an outer peripheral portion of a wall surface joining surface to which cover 111 of flange 110 is fixed is structured such as to be closer to an inner peripheral side than end portion 111b of an outer periphery of cover 111 at a time when cover 111 is attached. Accordingly, groove 126 is formed between wall surface 105 and cover 111. Caulking agent 124c is applied to groove 126 all around an entire periphery.

Figure 16:
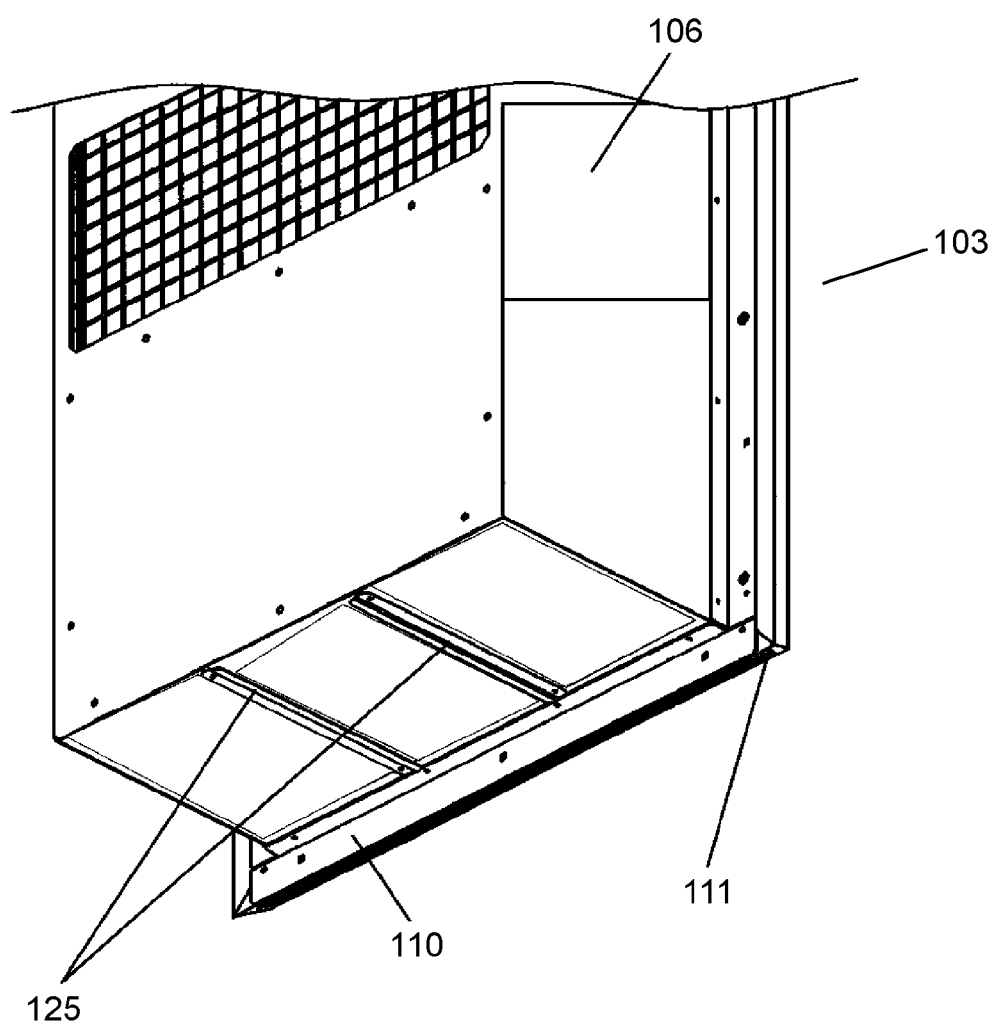
FIG. 16 is a perspective view showing a bottom portion of the heat exchange device in Embodiment 2.

FIG. 16 is a perspective view of a bottom portion of the heat exchange device in the present embodiment as seen from a bottom surface side. As shown in FIG. 16, main body case 106 of heat exchange device 103 is provided in its bottom surface with rail 125 serving as a rail-shaped reinforcing member which extends in a direction from the inside air side to the ambient air side. In this case, a left side is the inside air side and a right side is the ambient air side, in FIG. 16.

Figure 17:
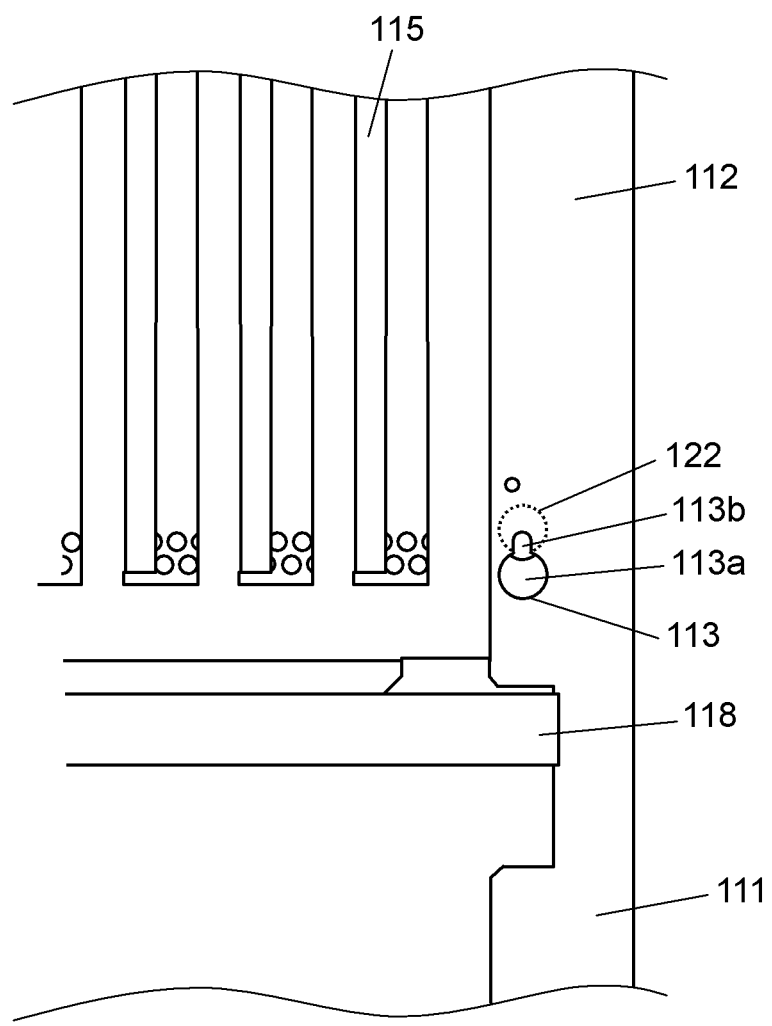
FIG. 17 is a front view showing a shape of cover fixing holes of the heat exchange device in Embodiment 2.
Figure 18:
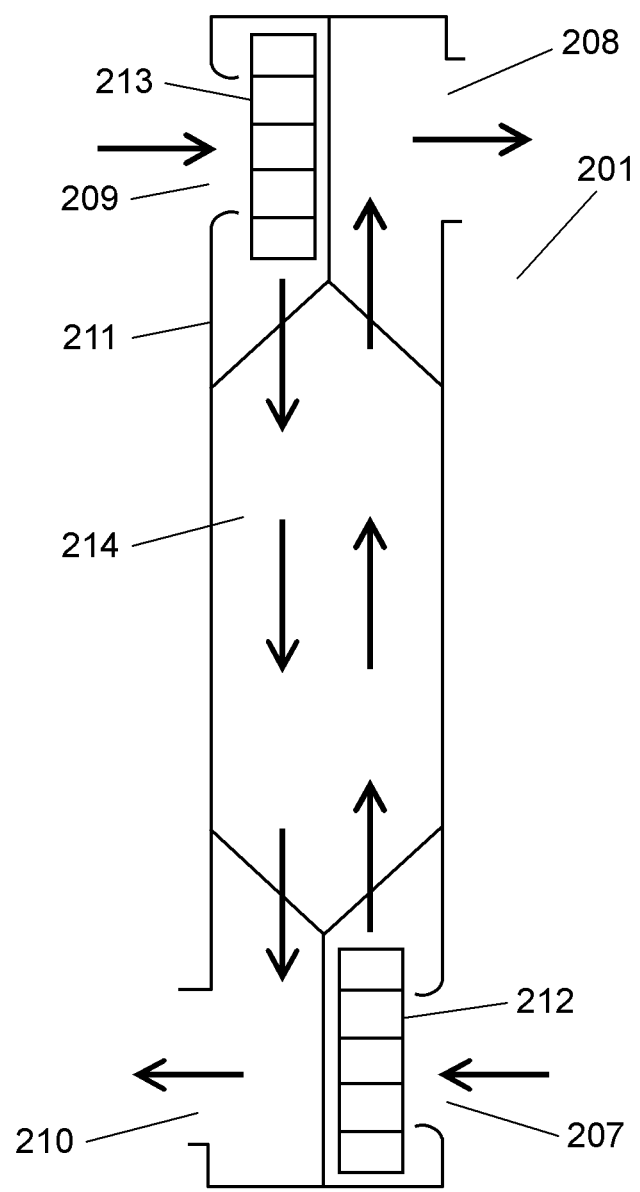
FIG. 18 is a schematic configuration view of a conventional heat exchange device.

FIG. 17 is a front view showing a shape of cover fixing holes as seen from the inside air side of the heat exchange device in the present embodiment. As shown in FIG. 17, a shape of cover fixing hole 113 provided in fixing surface 112 of the cover is formed by lower hole portion 113a and upper hole portion 113b. Lower hole portion 113a is formed in such a hole diameter that a screw head of cover fixing screw 121 (see FIG. 10) passes through, and upper hole portion 113b is formed such a dimension that the screw head of cover fixing screw 121 does not pass through and a thread portion of cover fixing screw 121 passes through. When the fixing of cover 111 is finished, a center of an end portion of upper hole portion 113b is formed in such a manner as to come into line with a center of cover attaching and detaching hole 122 (see FIGS. 9 to 11) formed in cover 111.

As mentioned above, in the present embodiment, surface 110b to which cover 111 is fixed in flange 110 is protruded from the inside air side of main body case 106 toward the ambient air side, with respect to surface 106a close to the ambient air side of main body case 106. Accordingly, a corner portion can be formed by main body case 106 and protruding portion 110c of flange 110. Accordingly, at the time of applying caulking agent 124b for preventing the rainwater from making an intrusion from the gap between main body case 106 of heat exchange device 103 and flange 110, it is possible to securely apply the caulking agent to a mating portion between main body case 106 and flange 110, and it is possible to secure a high water proofing property.

A description will be given of a procedure for attaching heat exchange device 103 to cabinet 2. An attaching work of main body case 106 of heat exchange device 103 is carried out in a state where cover 111 is detached. First of all, rail 125 provided in the bottom surface of main body case 106 of heat exchange device 103 is placed in the opening provided in wall surface 105 of cabinet 2, and is pushed toward cabinet 2. At this time, since rail 125 is formed in the direction from the ambient air side of cabinet 2 toward the inside air side, it is possible to easily slide heat exchange device 103. Since rail 125 doubles as a reinforcing member, it is possible to carry out the attachment of heat exchange device 103 without damaging the bottom surface of main body case 106 at the time of getting heat exchange device 103 on the opening of wall surface 105, and at the time of sliding heat exchange device 103.

Next, heat exchange device 103 is fixed by main body fixing screw 104 in such a manner as to bring flange 110 into close contact with wall surface 105, after being compressed to cabinet 2.

Next, cover 111 is attached. Before attaching cover 111, cover fixing screw 121 is screwed in flange 110 while the screw head is suspended at a thickness of cover 111 or more. In this state, cover 111 is slid downward after putting the screw head of cover fixing screw 121 through lower hole portion 113a of cover fixing hole 113 in cover 111. With this configuration, cover fixing screw 121 catches on a narrow portion (upper hole portion 113b) of cover fixing hole 113. In other words, it comes to a temporarily fixing state, and cover 111 is not detached even if a hand is released from cover 111. Thereafter, a screw driver is inserted to the inner portion of cover 111 from cover attaching and detaching hole 122, and fastens cover fixing screw 121 existing in a far side of cover attaching and detaching hole 122. Accordingly, it is possible to fix cover 111 to main body case 106. As mentioned above, in the present embodiment, since it is possible to achieve the temporary fixing state where cover 111 is not detached even if a hand is released from cover 111, it is possible to easily carry out the thereafter fixing work of cover 111 by the screw driver.

Further, when heat exchange device 103 is attached to wall surface 105, main body fixing screw 104 and cover fixing screw 121 come to a state where it is under cover of the inner portion of cover 111, and cannot be easily identified from an outer appearance.

Next, in the case of detaching cover 111, the screw driver is inserted to the inner portion of cover 111 from cover attaching and detaching hole 122, and loosens cover fixing screw 121 existing in a far side of cover attaching and detaching hole 122. Thereafter, cover 111 is slid to the above of heat exchange device 103. Accordingly, the screw head of cover fixing screw 121 is shifted to a position (lower hole portion 113a) of such a hole diameter that the screw head of cover fixing screw 121 in cover fixing hole 113 passes through. Therefore, it is possible to draw cover 111 away from heat exchange device 103. Accordingly, cover fixing screw 121 is detached from cover fixing hole 113, and it is possible to easily detach cover 111 from heat exchange device 3.

End portion 110d of the wall surface joining surface to which cover 111 is fixed in flange 110 is structured such that it comes more to the inner peripheral side than end portion 111b in the outer periphery of cover 111, at a time when cover 111 is attached, that is, groove 126 is formed. Accordingly, caulking agent 124c can be compressed to groove 126 between cover 111 and wall surface 105 of cabinet 2. In other words, it is possible to easily carry out a caulking process of the outer periphery of main body case 106. Further, since a contact area of caulking agent 124c with main body case 106, that is, a seal area is increased, it is possible to secure a water proofing property.

Further, when performing maintenance, in the case that cover 111 is detached at the time of maintaining heat exchange device 103, a cutter is inserted in caulking agent 124c in the outer periphery of cover 111, a leading end thereof is inserted to groove 126, and the cutter is moved along groove 126. Accordingly, it is possible to easily cut caulking agent 124c applied to the outer periphery.

In the work after cutting caulking agent 124c, it is possible to easily detach cover 111, as mentioned above. Accordingly, it is possible to easily carry out a cleaning of ambient air exhausting louver 115 in the inner portion of cover 111, ambient air sucking louver 117, ambient air discharge port 114 of heat exchange device 103 and ambient air suction port 116. Further, since cover 111 can be completely detached from main body case 106 of heat exchange device 103, it is possible to wash cover 111 just as is.

After maintaining heat exchange device 103, it is possible to easily attach cover 111 in the same procedure as that which is carried out at the time of attaching heat exchange device 103 to cabinet 2, and it is possible to easily carry out a maintenance.

Further, the upper surface, the bottom surface and the side surface of cover 111 have such an inclined surface that is narrowed from the wall surface side (the inside air side) toward the outdoor side (the ambient air side). Further, draining small hole 123 is provided in the lowest portion of the bottom surface of cover 111. Accordingly, the rainwater adhering to the upper surface of cover 111 flows to the front surface side of cover 111, that is, the ambient air side in the opposed direction to cabinet 2, and drips along cover 111. Accordingly, it is possible to prevent the rainwater from staying in the attaching portion of one of cabinet 2 and heat exchange device 103, that is, caulking agent 124c. Further, the rainwater staying in the bottom surface of cover 111 flows toward the lowest portion of the bottom surface of cover 111, and drips outdoor from draining small hole 123 provided in the lowest portion. Accordingly, it is possible to prevent the rainwater from staying in the attaching portion of the other of cabinet 2 and heat exchange device 103, that is, caulking agent 124b. Therefore, it is possible to prevent the rainwater staying in caulking agent 124b from erroneously making an intrusion into cabinet 2 in the case of cutting caulking agent 124b at the time of maintaining heat exchange device 103.

Further, in the positional relationship in the vertical direction of ambient air discharge port 114, packing 118 and ambient air discharging vent hole 119, lower end 114b of ambient air discharge port 114, lower end 119b of ambient air discharging vent hole 119 and upper end 118t of packing 118 are formed in this order from the above. Accordingly, even in the case that the rainwater enters into the inner portion of cover 111, and the rainwater stays in upper end 118t of packing 118, the rainwater is drained to the outer portion of cover 111 from ambient air discharging vent hole 119 since lower end 119b of ambient air discharging vent hole 119 exists at the lower position than lower end 114b of ambient air discharge port 114. In other words, it is possible to prevent the rainwater from making an intrusion into the inner portion of heat exchange device 103 from ambient air discharge port 114.

INDUSTRIAL APPLICABILITY

Since it is possible to easily detach the cover and it is possible to easily maintain from the front surface side of the heat exchange device, the present invention is useful as a heat exchange device with respect to a heat generating element, for example, a base station of a communication device, cooling equipment in the other outdoor installed devices, and the like, and a heat generating element containing device using the same.

REFERENCE MARKS IN THE DRAWINGS

1: base station
2: cabinet
2a, 105: wall surface
3, 103: heat exchange device
4, 106: main body case
5, 116: ambient air suction port
5a, 116a: main body case ambient air suction port
6, 114: ambient air discharge port
6a, 114a: main body case ambient air discharge port
7, 131: inside air suction port
8, 132: inside air discharge port
9, 108: ambient air blower
10, 107: inside air blower
11, 109: heat exchanger
12, 111: cover
12a: flange joining inclined surface
12b: edge portion
12c: hole
12d: fold-back portion
12e, 117: ambient air sucking louver
12f, 115: ambient air sucking louver
12g: thread hole
12m, 119: ambient air discharging vent hole
12n, 120: ambient air sucking vent hole
13, 110: flange
13a: bent portion
13b: wall surface joining surface
14, 104: main body fixing screw
15, 121: cover fixing screw (cover fixing member)
16a, 124b, 124c: caulking agent
106a, 110a, 110b: surface
110c: protruding portion
110d, 111b: end portion
111a: inclined surface
112: fixing surface
113: cover fixing hole
113a: lower hole portion
113b: upper hole portion 114b, 119b: lower end
118: packing (partition member)
118t: upper end
122: cover attaching and detaching hole
123: draining small hole
125: rail
126: groove

The invention claimed is:

1. A heat exchange device comprising:
an air blower for circulating ambient air;
a heat exchanger for exchanging heat between the ambient air circulated by the blower and inside air;
a main body case containing therein the air blower and the heat exchanger;
a flange provided on the main body case, having a wall surface joining surface joined to a wall surface where the main body case is disposed; and
a cover attached to the flange, having a louver in a side facing the flange and a plurality of vent holes in a side of the ambient air opposite to the flange, and covering an ambient air side of the main body case,
wherein the flange has a bent portion formed into an L-shaped cross section around a periphery thereof in a manner to extend to the ambient air side,
wherein the cover has a flange joining inclined surface joined to the bent portion of the flange, the flange joining inclined surface including cover fixing holes in a joined portion joined to the bent portion, and a spacing between the cover fixing in an upper portion is different from a spacing between the cover fixing holes in a lower portion.

2. The heat exchange device according to claim 1, wherein the wall surface joining surface further extends to an outer periphery of the bent portion.

3. The heat exchange device according to claim 2, wherein the cover has an edge portion joined to a surface of the flange opposite to the wall surface joining surface around a periphery of the flange joining inclined surface, the edge portion having a hole of a larger diameter than an outer diameter of a main body fixing member for fixing the wall surface joining surface of the flange and the wall surface.

4. The heat exchange device according to claim 3, wherein the cover has a fold-back portion bent toward the ambient air side around the periphery of the edge portion.

5. The heat exchange device according to claim 2, wherein the bent portion is provided in a vicinity of a joined portion of the flange joined to the main body case.

6. A heat exchange device comprising:
an air blower for circulating ambient air;
a heat exchanger for exchanging heat between the ambient air circulated by the blower and inside air;
a main body case containing therein the air blower and the heat exchanger;
a flange provided on the main body case, having a wall surface joining surface joined to a wall surface where the main body case is disposed; and
a cover attached to the flange having a louver in a side facing the flange and a plurality of vent holes in a side of the ambient air opposite to the flange, and covering an ambient air side of the main body case,
wherein
the wall surface joining surface of the flange extends to an outer periphery of the ambient air side, the cover has a fixing surface bent to an inner side and fixed to a surface of the flange opposite to the wall surface joining surface with a cover fixing member, and a cover fixing member attaching and detaching hole is provided on the fixing surface of the cover confronting the cover fixing member for attaching and detaching the cover fixing member, the flange is formed into an L-shaped cross sectional form, one surface of the L-shaped form is fixed to a side surface of the main body case, the cover is attached to an other surface of the L-shaped form, the surface to which the cover is attached to the flange protrudes to the ambient air side from a surface close to the ambient air side in the main body case.

7. The heat exchange device according to claim 6, wherein a caulking agent is applied to a corner between the flange protruding to the ambient air side from the surface close to the ambient air side of the main body case and the main body case.

8. The heat exchange device according to claim 6, wherein the cover has an ambient air suction port for sucking the ambient air, an ambient air discharge port for discharging the ambient air, and a partition member for preventing the discharged ambient air from being sucked between the ambient air suction port and the ambient air discharge port, the plurality of vent holes on the cover further includes a plurality of ambient air discharging vent holes on a surface which is opposed to the ambient air discharge port, and a plurality of ambient air sucking vent holes on a surface which is opposed to the ambient air suction port and a bottom surface, the ambient air suction port is positioned below the ambient air discharge port, a lower end of the ambient air discharging vent hole formed on the surface which is opposed to the ambient air discharge port is positioned below the ambient air discharge port, and an upper end of the partition member is positioned between the ambient air discharge port and the ambient air suction port below the ambient air discharging vent hole.

9. The heat exchange device according to claim 6, wherein an upper surface of the cover has such an incline as to descend to the ambient air side from the inside air side, a bottom surface of the cover has such an incline as to ascend toward the ambient air side from the inside air side, and a plurality of draining small holes are provided in a lowest portion of the bottom surface of the cover.

10. The heat exchange device according to claim 6, wherein an end portion of the wall surface joining surface of the flange exists further in an inner peripheral side than an end portion of the cover.

11. The heat exchange device according to claim 6, wherein a bottom surface of the main body case is provided with a rail-like reinforcing member heading for the inside air side from the ambient air side.

12. The heat exchange device according to claim 6, wherein the cover fixing member is a screwing member, the fixing surface has a cover fixing member hole to which the screwing member is inserted, the cover fixing member hole is formed by a lower hole portion and an upper hole portion, the lower hole portion has such a magnitude that a head portion of the screwing member passes through, the upper hole portion has such a magnitude that the head portion of the screwing member does not pass through and a thread portion passes through.

13. The heat exchange device according to claim 1, wherein the air blower is provided in a lower portion of the main body case, sucks the ambient air from a lower portion of the cover, and discharges the sucked ambient air from an upper portion of the cover.

14. The heat exchange device according to claim 1, wherein the vent hole is formed by a punching hole, and the louver is provided integrally with the cover in correspondence to a plurality of the vent holes.

15. The heat exchange device according to claim 1, wherein
the louver further includes an ambient air discharging louver and an ambient air sucking louver, the ambient air sucking louver including a louver board arranged in a lateral direction in an air suction side of the ambient air, and the ambient air discharging louver including a louver board arranged in a longitudinal direction in a discharge side of the ambient air.

16. A heat generating element containing device on which the heat exchange device of claim 1 is mounted.

* * * * *